United States Patent [19]
Dvir et al.

[11] Patent Number: 6,045,433
[45] Date of Patent: Apr. 4, 2000

[54] APPARATUS FOR OPTICAL INSPECTION OF WAFERS DURING POLISHING

[75] Inventors: Eran Dvir, Givatayim; Eli Haimovich, Moshav Magshimim; Benjamin Shulman, Rehovot, all of Israel

[73] Assignee: Nova Measuring Instruments, Ltd., Rehovot, Israel

[21] Appl. No.: 08/497,382

[22] Filed: Jun. 29, 1995

[30] Foreign Application Priority Data

May 23, 1995 [IL] Israel ......................................... 113829

[51] Int. Cl.[7] .................................................. B24B 49/00
[52] U.S. Cl. .................................. 451/6; 451/41; 451/285
[58] Field of Search ............................ 451/41, 285, 287, 451/288, 6

[56] References Cited

U.S. PATENT DOCUMENTS

| | | | |
|---|---|---|---|
| 4,018,638 | 4/1977 | Singer et al. | 156/626 |
| 4,793,895 | 12/1988 | Kaanta et al. | 156/627 |
| 5,081,421 | 1/1992 | Miller et al. | 324/671 |
| 5,081,796 | 1/1992 | Schultz | 451/6 |
| 5,125,740 | 6/1992 | Sato et al. | 356/128 |
| 5,157,877 | 10/1992 | Hashimoto | 51/283 R |
| 5,240,552 | 8/1993 | Yu et al. | 156/636 |
| 5,337,015 | 8/1994 | Lustig et al. | 324/671 |
| 5,433,651 | 7/1995 | Lustig et al. | 451/6 |
| 5,492,594 | 2/1996 | Burke et al. | 451/28 |

*Primary Examiner*—Eileen P. Morgan
*Attorney, Agent, or Firm*—Skjerven, Morrill, MacPherson, Franklin and Friel LLP

[57] ABSTRACT

An optical system is disclosed for the inspection of wafers during polishing which also includes a measurement system for measuring the thickness of the wafer's top layer. The optical system views the wafer through a window and includes a gripping system, which places the wafer in a predetermined viewing location while maintaining the patterned surface completely under water. The optical system also includes a pull-down unit for pulling the measurement system slightly below the horizontal prior to the measurement and returns the measuring system to the horizontal afterwards.

4 Claims, 7 Drawing Sheets

APPARATUS FOR OPTICAL INSPECTION OF WAFERS DURING POLISHING

FIELD OF THE INVENTION

The present invention relates to wafer polishing apparatus in general and to measuring systems incorporated into such apparatus in particular.

BACKGROUND OF THE INVENTION

Wafer polishing systems are known in the art. They polish the top layer of semiconductor wafers to a desired thickness. To do so, the wafer being polished is immersed in a slurry of water and chemicals during the polishing process. Once the wafer has been polished and washed down, it is placed into an exit station known by some companies as a "water track", after which the wafer is placed into a cassette of wafers. The cassette is maintained within a water bath until full, after which the entire cassette is brought to a cleaning station to remove any chemicals and slurry particles still remaining on the wafers in the cassette and to dry the wafers. After cleaning, the wafers are brought to a measurement station to determine if the polisher produced the desired thickness of their top layers.

Figure 1:
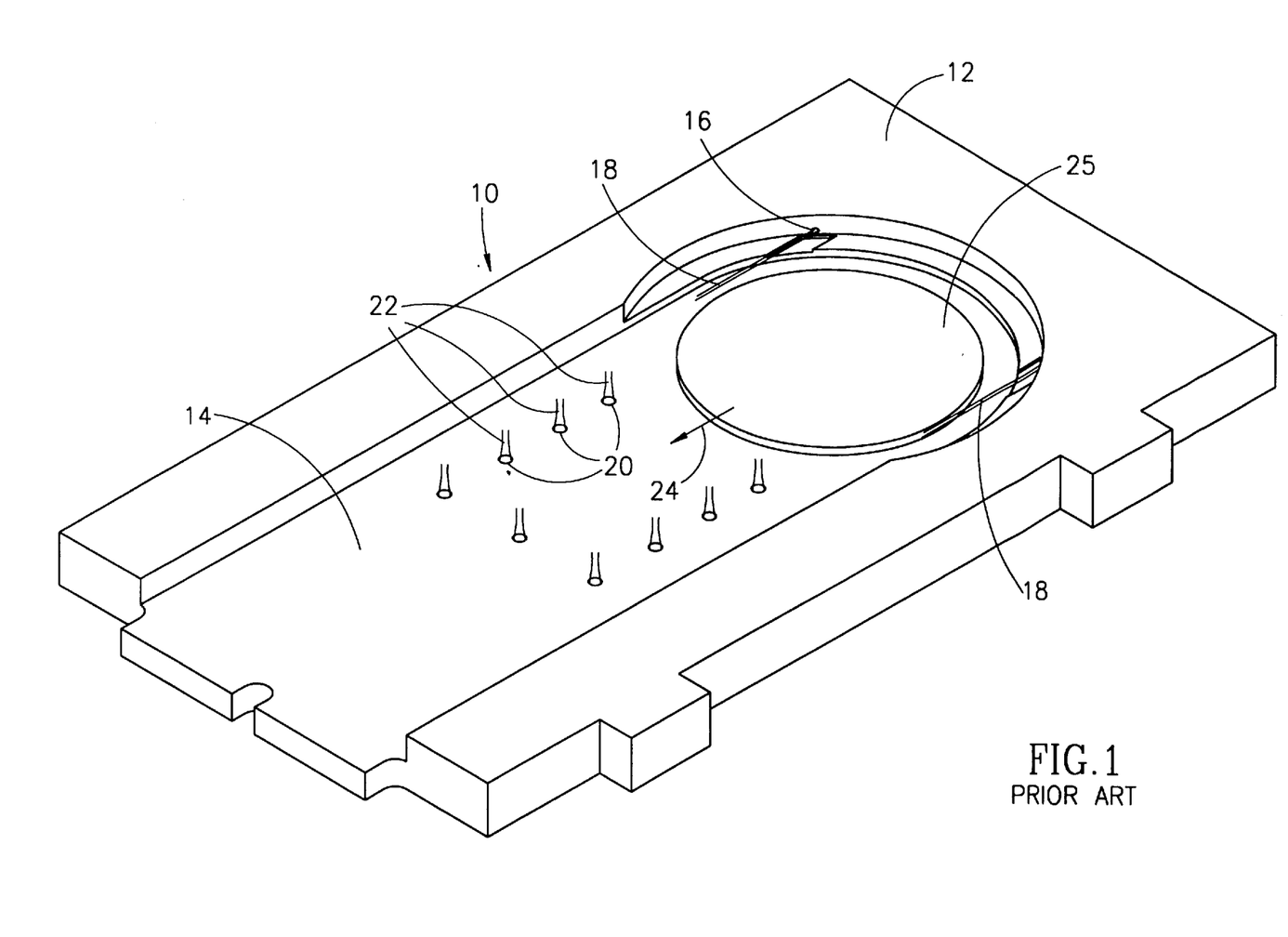
FIG. 1 is a schematic illustration of a prior art water track.

FIG. 1, to which reference is now briefly made, illustrates a prior art water track, such as the water track of the #372 Polisher manufactured by IPEC Western Inc. of Phoenix, Ariz., USA. The water track, labeled 10, comprises a frame 12 and a base 14. Frame 12 has jet holes 16 connected to jets (not shown) which emit streams 18 of water through holes 16. Base 14 has holes 20 connected to bubblers (not shown) which bubble small amounts of water 22 through holes 20. When a wafer 25 is dropped into water track 10, pattern-side down, the jets and bubblers are activated. Streams 18, from the water jets, serve to force the wafer 25 in the direction indicated by arrow 24. Small streams 22 push the wafer 25 slightly away from the base 14 and ensure that, while the wafer 25 moves through the track, it never rubs against base 14 and thus, the pattern on the wafer is not scratched.

Other companies produce polishers whose exit stations are formed just of the cassettes. Such a polisher is the 6DS-SP polisher of R. Howard Strasbaugh Inc. San Luis Obispo, Calif., USA.

SUMMARY OF THE PRESENT INVENTION

It is an object of the present invention to provide a measurement system installable within a polishing machine and, more specifically, within the exit station of a polishing machine.

In accordance with a preferred embodiment of the present invention, the present invention includes an optical system, which views the wafer through a window in the exit station, and a gripping system, which places the wafer in a predetermined viewing location within the exit station while maintaining the patterned surface completely under water. The present invention also includes a pull-down unit for pulling the measurement system slightly below the horizontal prior to the measurement and returns the measuring system to horizontal afterwards.

In accordance with a first preferred embodiment of the present invention, the gripping system includes a raisable gate which collects the wafer in a predetermined location, and a gripper which grips the wafer, carries it to the viewing location and immerses the wafer, along a small angle to the horizontal, in the water. The gripper also holds the wafer in place during the measurement operation, after which, it releases the wafer and the raisable gate is raised.

The present invention incorporates the method of immersing an object into water such that very few bubbles are produced on the wafer surface. The method of the present invention preferably includes the step of immersing the object while it is held such that its surface plane is at a small angle to the horizontal.

In a second embodiment, the measurement system includes a water bath and a gripping system thereabove. The gripping system includes wafer holding elements, which receive the wafer, and a gripper whose initial location is above the expected reception location of the wafer. The gripper is flexibly connected at an angle to a piston such that the wafer is immersed in the water at an angle to the horizontal.

BRIEF DESCRIPTION OF THE DRAWINGS

The present invention will be understood and appreciated more fully from the following detailed description taken in conjunction with the drawings in which.

DETAILED DESCRIPTION OF THE PRESENT INVENTION

Figure 2:
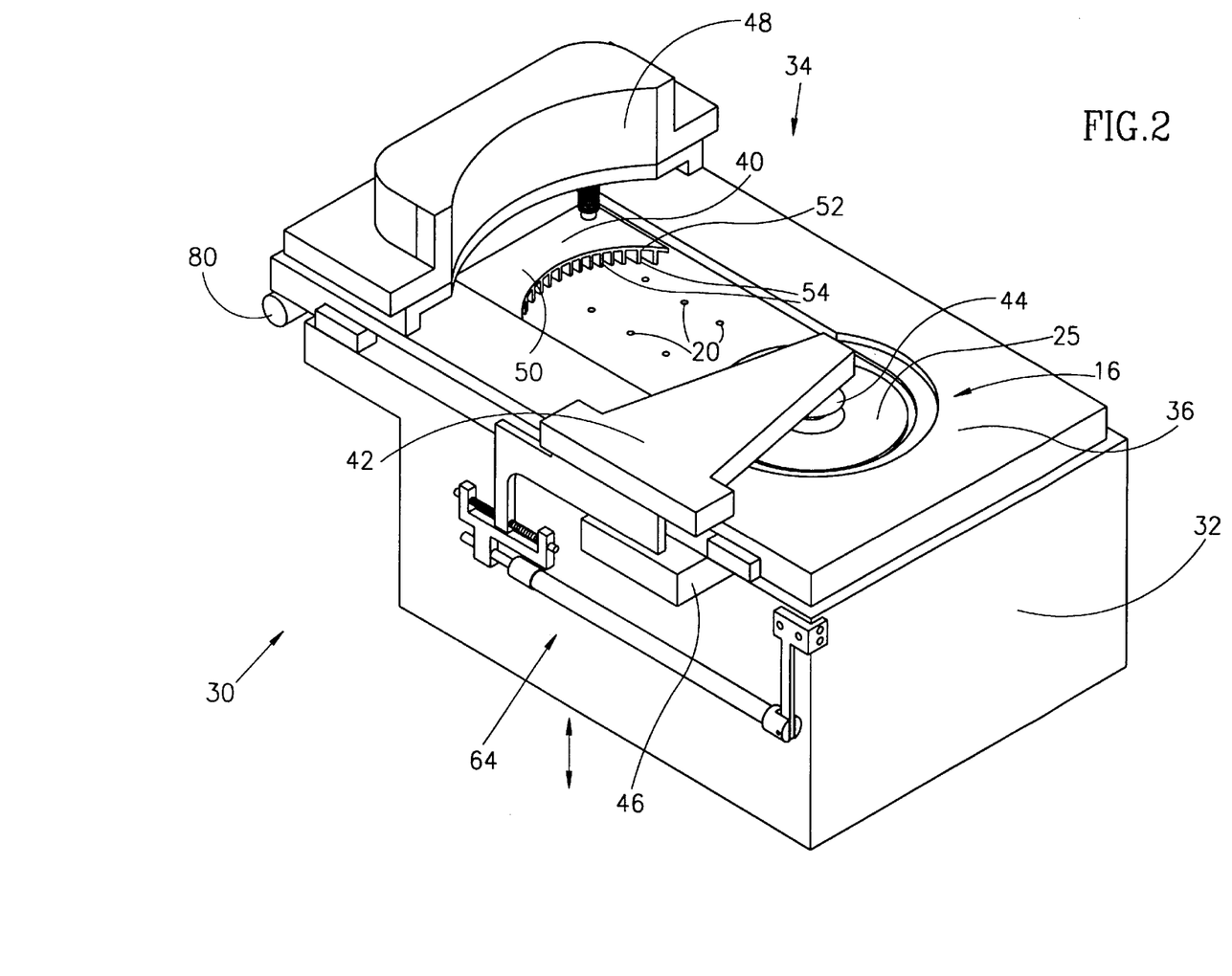
FIG. 2 is a schematic illustration of a measurement system installable within a polishing machine, the measurement system being constructed and operative in accordance with a preferred embodiment of the present invention.

Reference is now made to FIG. 2, which illustrates a measurement unit installable within a polishing machine, such as the IPEC Westech machine, the measurement system being constructed and operative in accordance with a preferred embodiment of the present invention and to FIGS. 3, 4, 5, 6, 7 and 8 which illustrate the operation of a gripping system forming part of the measurement system of FIG. 2. Similar reference numerals are utilized to refer to elements of the water track previously discussed.

Figure 9:
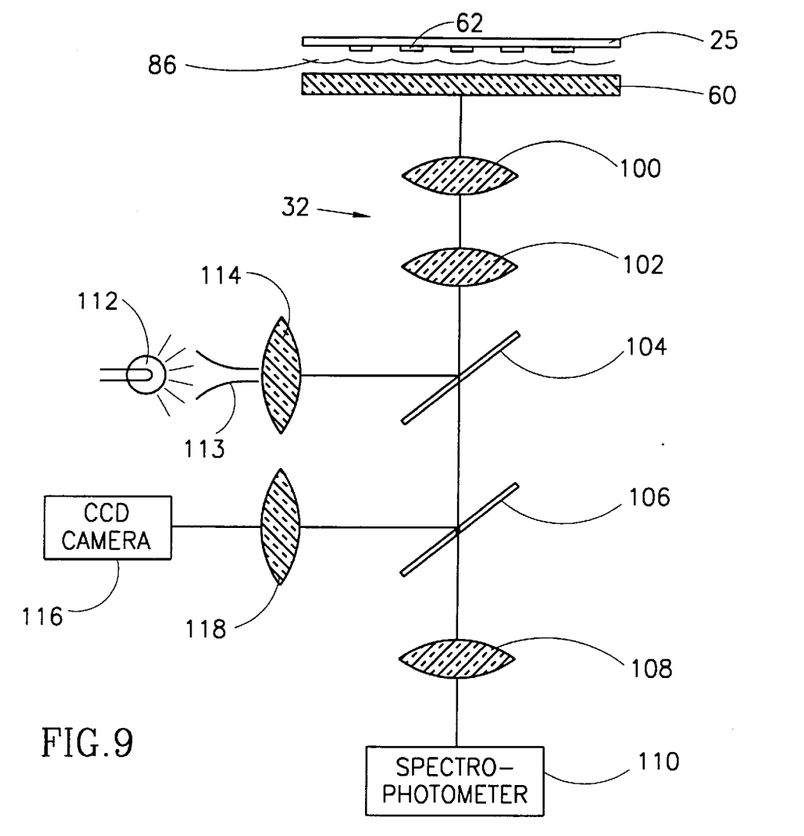
FIG. 9 is a schematic illustration of an example optical system forming part of the measurement system of the present invention.

The measurement system, labeled 30, comprises an optical system 32 and a gripping system 34 operative in conjunction with a water track 36. The optical system 32 can be any optical system which measures the thickness of the top layer of the wafer through water. FIG. 9 provides one example of such a optical system; other optical systems are also incorporated into the present invention.

The gripping system 34 comprises a raisable gate 40, a translatable gripper 42, a vacuum pad 44 and a vacuum system 46. Gate 40 is controlled by a lifting mechanism 48 which raises and lowers gate 40 as necessary. Gate 40 has an upper surface 50 with a curved outer edge 52 and a plurality of protrusions 54 extending downward into the water from the upper surface 50. Protrusions 54 provide a lower surface onto which the gate 40 is lowered while enabling the water to pass through the gate 40. Curved edge 52 is shaped to match the curved edge of the wafer 25 so that, when gate 40 is in its lowered position, gate 40 will both keep the wafer 25 from passing out of the water track and to hold the wafer 25 in a repeatable location.

Gripper 42 translates between the wafer collecting position defined by the curved edge 52 and a wafer measuring location indicated in FIG. 2 by the wafer 25. Although not visible in FIG. 2, the base of the water track at the wafer measuring location has been replaced by a window 60 (FIGS. 3–9) to enable the optical system 32 to view the patterned surface 62 of the wafer 25. For the purposes of the explanation, the patterned surface 62 is shown exaggeratedly in the Figures.

Gripper 42 can be translated by any translation system; an example of one such system is provided in FIG. 2 and labeled 64.

The vacuum pad 44 is typically a bellows-shaped pad and is mounted at the end of the gripper 42 and is connected to the vacuum system 46. The vacuum pad 44 creates a suction so that gripper 42 can raise the wafer 25 and move it from the wafer collecting position to the wafer measuring location. In addition, the vacuum is maintained during the measurement and only released once the measurement is complete.

Figure 3:
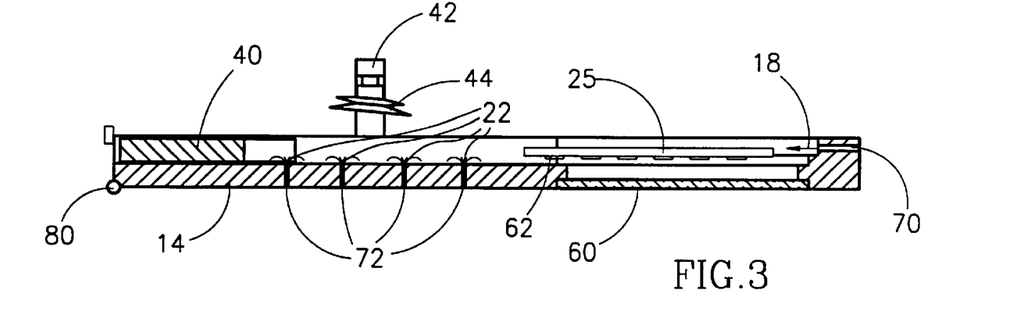
FIGS. 3, 4, 5, 6, 7 and 8 are schematic, side view illustrations of a gripping system forming part of the measurement system of FIG. 2 in various stages of operation.

FIGS. 3–8 illustrate the operation of the gripping system 34. Initially, and as shown in FIG. 3, the jets, labeled 70, and the bubblers, labeled 72, of the water track are operated and the gate 40 is lowered. The polisher (not shown) places the wafer 25 within the water track and the streams 18 from the jets 70 push the wafer 25 towards the gate 40. The gripper 42 is at the wafer collecting position, shown to the left in FIGS. 3–8.

Figure 4:
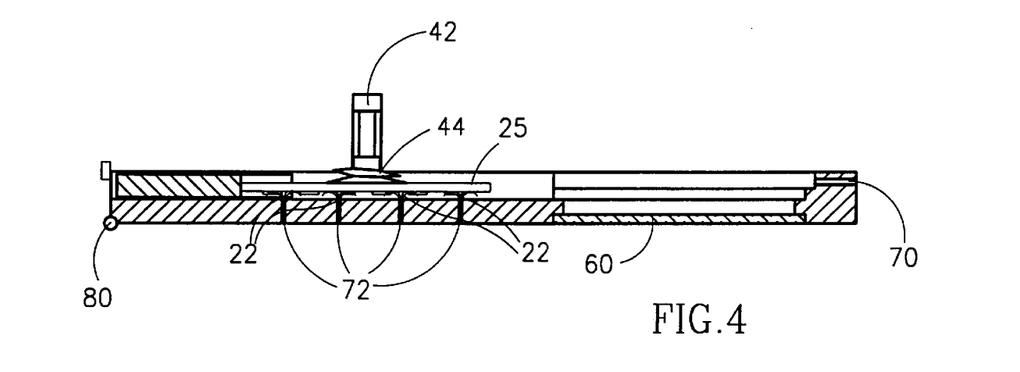
Figure 5:
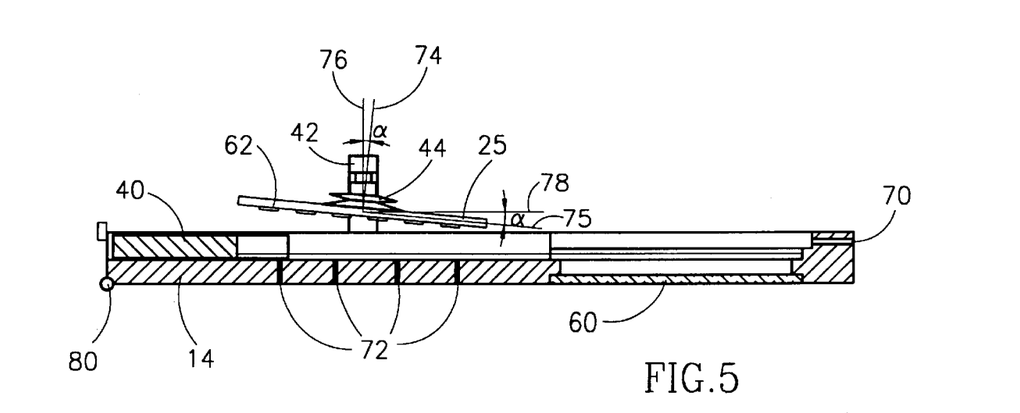

Once the wafer 25 is in the wafer collecting position, as shown in FIG. 4, gripper 42 lowers vacuum pad 44 to grab the wafer 25. It will be appreciated that gripper 42 can be formed of any suitable mechanism, such as a piston, which can move vacuum pad 44 up and down on command. Since bubblers 72 are operating, the small streams 22 maintain the wafer 25 away from the base 14 of the water track.

The gripper 42 then pulls the wafer 25 out of the water (FIG. 5) and the jets 70 are deactivated. In accordance with a preferred embodiment of the present invention, the axis 74 of symmetry of the vacuum pad 44 is formed at a small angle a from the vertical axis 76. As a result, a long axis 75 of the wafer 25 is at the same small angle a to the horizontal axis 78. Angle $\alpha$ is typically in the range of 2–5°.

Figure 6:
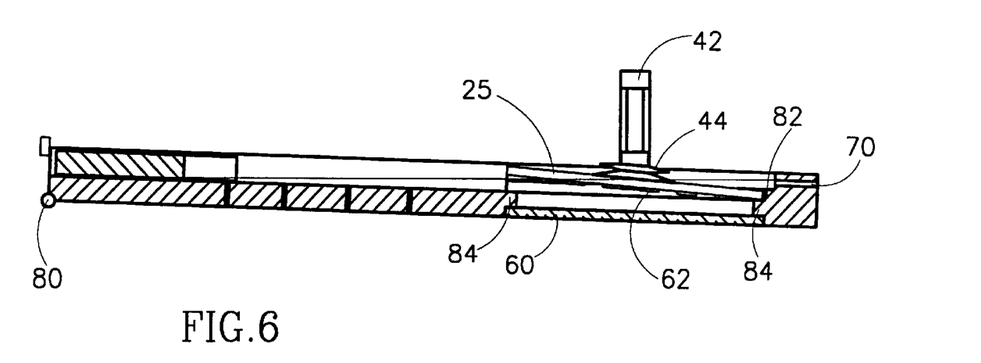
Figure 7:
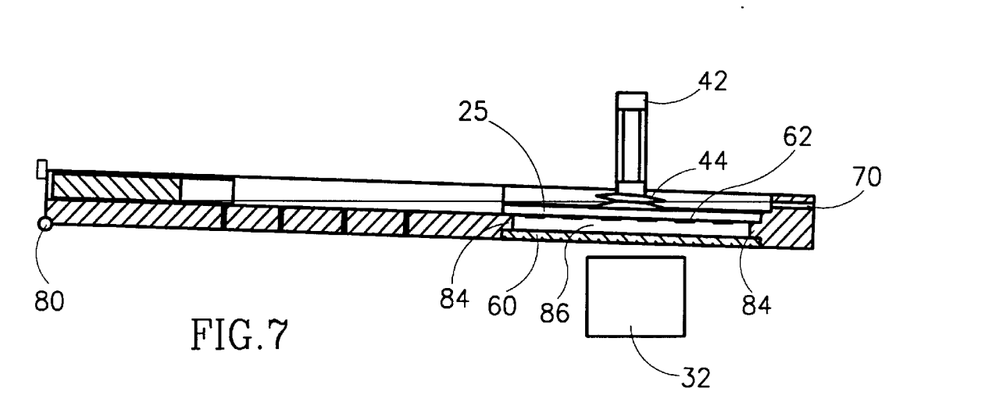
Figure 8:
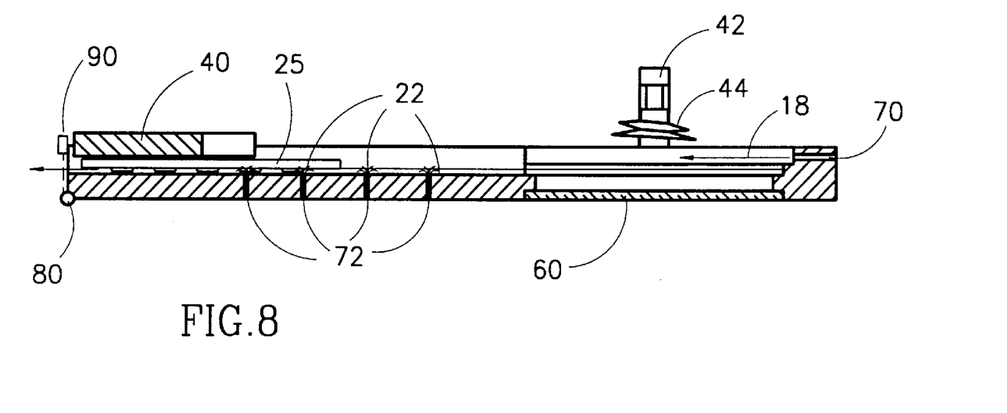

Translation unit 64 then moves gripper 42 to the wafer measuring position, shown to the right in FIGS. 4–8. At the same time and as shown in FIG. 6, a pull-down mechanism slightly lowers the entire water track, gripping and optical system unit (at an angle of 1–3°), about a hinge 80 (FIGS. 2–8), to force the water toward the wafer measuring position. Other methods of forcing the water towards the measuring position are also incorporated in the present invention.

After the lowering of the water track, gripper 42 lowers the wafer 25 towards the window 60. Since the vacuum pad 44 is angled, the wafer 25 does not enter the water all at once. Instead, wafer 25 enters the water gradually. Initially, only the side labeled 82 is immersed. As the gripper 42 pushes the vacuum pad 44 further down, more and more of the wafer 25 becomes immersed until the entire wafer 25 is within the water. Vacuum pad 44 is flexible enough to accommodate the changed angle of wafer 25.

It will be appreciated that, by gradually immersing the wafer in the water, few, if any, bubbles are created near the patterned surface of the wafer 25.

It is noted that the wafer 25 does not rest against the window 60. Instead, it is held against protruding surfaces 84 such that there is a layer of water 86 between the wafer 25 and window 60. Due to the gradual immersion of wafer 25, layer 86 of water has little, if any, bubbles in it and therefore provides a uniform connecting medium between the optical system 32 and the patterned surface 62 of wafer 25.

Once the optical system 32 has finished measuring the patterned surface 62 of wafer 25, gripper 42 returns vacuum pad 44, with wafer 25 still attached, to its upper position. The pull-down mechanism rotates the water track about hinge 80 to return to its original position, gate 40 is raised, and jets 70 and bubblers 72 are activated. The vacuum system 46 releases the vacuum and the wafer 25 falls into the water track. The flow of water causes the wafer 25 to move toward and under the now raised gate 40. A sensor 90 determines when the wafer 25 successfully passes out of the water track. The process described hereinabove can now begin for the next wafer.

Reference is now made to FIG. 9 which schematically illustrates an example of a suitable optical system 32. Optical system 32 is a microscope-based spectrophotometer and comprises an objective lens 100, a focusing lens 102, a beam splitter 104, a pin hole mirror 106, a relay lens 108 and a spectrophotometer 110. It additionally comprises a light source 112, a condenser 114, a charge coupled device (CCD) camera 116 and a second relay lens 118.

Light from light source 112 is provided, along an optical fiber 113, to condenser 114. In turn, condenser 114 directs the light towards beam splitter 104. Beam splitter 104 directs the light towards the wafer surface via lenses 102 and 100 and via window 60 and water layer 86.

The reflected light from the patterned surface 62 is collected by objective 100 and focused, by lens 102, onto pin hole mirror 106. Relay lens 108 receives the light passed through pin hole mirror 106 and focuses it onto the spectrophotometer 110.

Pin hole mirror 106 passes light through its hole towards spectrophotometer 110 and directs the light hitting the mirror surface towards CCD camera 116. Second relay lens 118 receives the light reflected by pin hole mirror 106 and focusses it onto the CCD camera 116.

Since the pinhole is placed at the center of the image plane which is the focal plane of lens 102, it acts as an aperture stop, allowing only the collimated portion of the light beam to pass through. Thus, the pinhole drastically reduces any scattered light in the system. Relay lens 108 collects the light from the pinhole and provides it to spectrophotometer 110.

Furthermore, since the pinhole is located at the image plane of the optical imaging system (lenses 100 and 102), only that portion of the light, reflected from the surface of wafer 25, which is the size of the pinhole divided by the magnification will come through the pinhole. Relay lens 118 collects the light and focuses it onto the CCD camera 116.

The pinhole serves to locate the measurement spot in the image of the wafer 25. Since the pinhole allows light to pass through it, rather than being reflected toward the CCD camera 116, the pinhole appears as a sharp dark point in the image produced by the lens 118. Thus, when viewing the CCD image, the location of the measurement spot is immediately known, it being the location of the dark spot.

Figure 10:
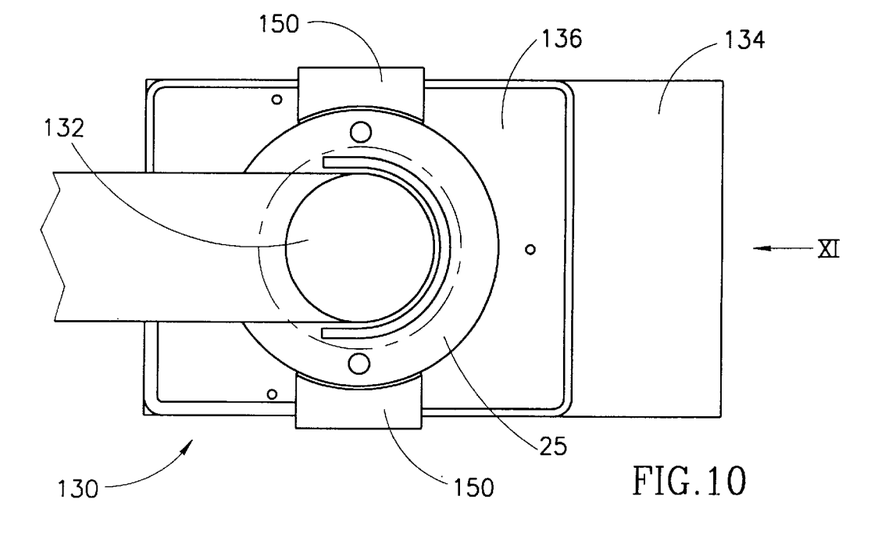
FIG. 10 is a top view of a second embodiment of the measurement system of the present invention.
Figure 11:
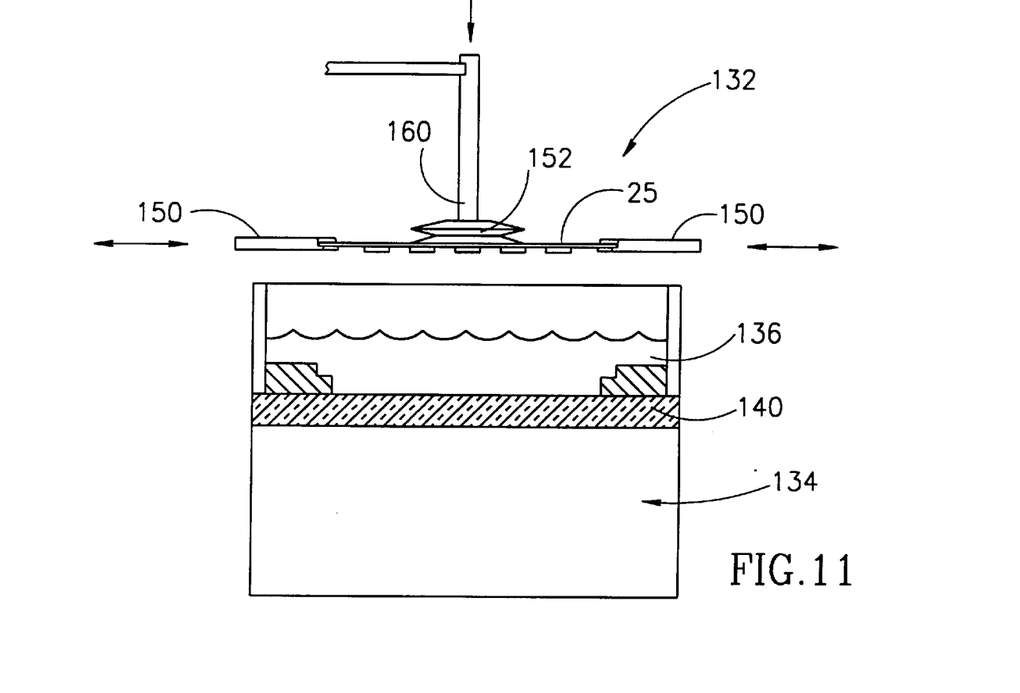
FIGS. 11, 12 and 13 are side views of the measurement system during receipt, transfer and measurement of the wafer, respectively.
Figure 12:
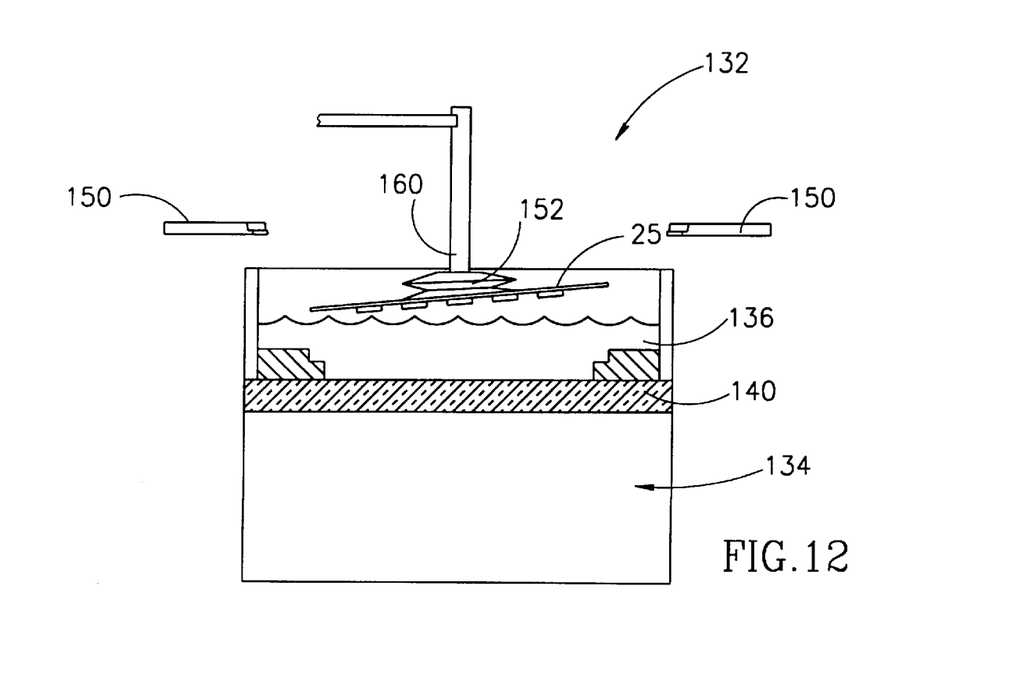
Figure 13:
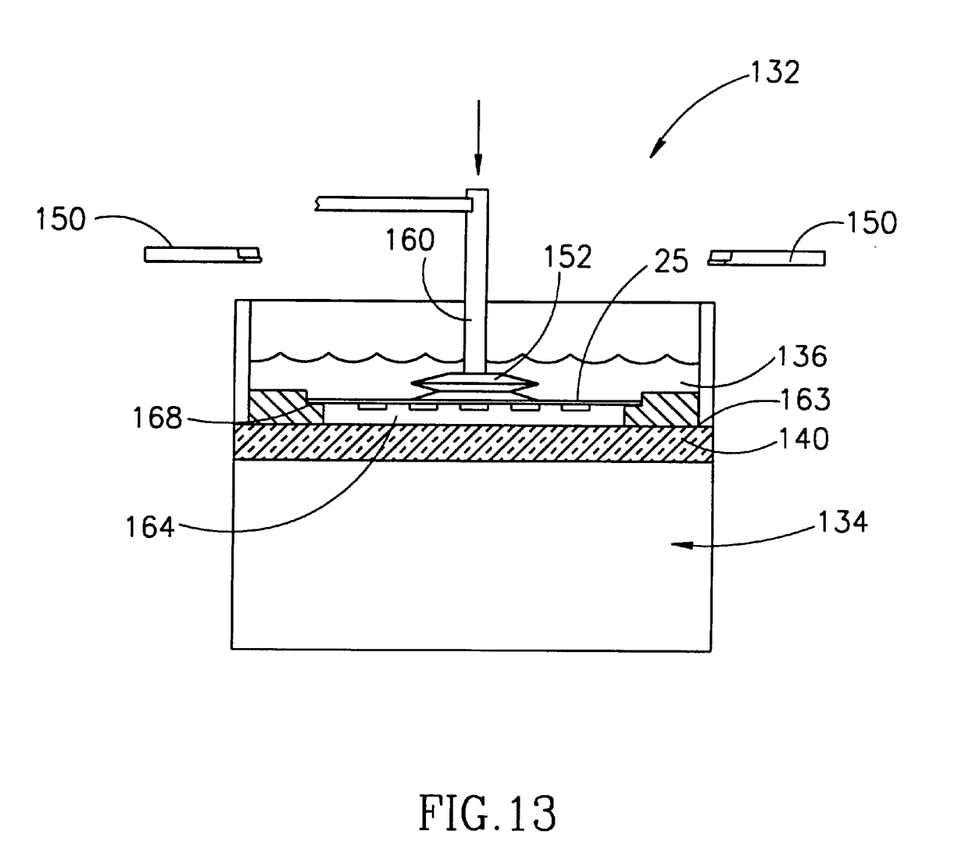

Reference is now made to FIGS. 10–13 which illustrate the thickness measuring of the present invention implemented in a polishing machine similar to that produced by Strasbaugh which has no water track. In this embodiment, the polishing machine or an external robot (not shown) brings the wafers 25 to an exit station of the polisher. When the measurement has finished, the robot brings the wafers 25 to their cassette at another exit station. FIG. 10 is a top view and FIGS. 11, 12 and 13 illustrate the measuring station in three states.

The measuring station 130 comprises a gripping unit 132, an optical system 134 and a water bath 136. The optical system 134 is located beneath the water bath 136 and can be any suitable optical system, such as the one described hereinabove. As in the previous embodiment, the water bath 136 has a window in its bottom surface, labeled 140 in FIG. 11, through which the optical system 134 can illuminate the wafer 25.

The gripping unit 132 comprises a wafer support 150, illustrated as being formed of two support elements, a vacuum pad 152, similar to vacuum pad 44, and a piston 160. The polisher places the wafer 25 on the wafer support 150 while the vacuum pad 152 is initially in a position above the support 150, as shown in FIG. 11. Once the wafer support 150 has the wafer in a predefined position, the vacuum pad 152, which is controlled by piston 160, moves toward the wafer and grabs it by applying a vacuum. Now that the vacuum pad 152 is holding the wafer, the wafer supports 150 move away, as indicated.

The piston 160 then pushes the vacuum pad-wafer combination toward the water bath 136. This is shown in FIG. 12 which also illustrates that the vacuum pad 152 holds the wafer 25 at a small angle $\alpha$ to the horizontal. The angle $\alpha$ is provided since, as in the previous embodiment, the axis of symmetry of the vacuum pad 152 is formed at a small angle $\alpha$ from the vertical axis. As in the previous embodiment, by immersing the wafer 25 into the water at the angle $\alpha$, few, if any, bubbles, remain on the undersurface of the wafer after full immersion.

FIG. 13 illustrates the wafer 25 at its fully immersed, measurement position. Typically, wafer 25 does not directly touch the water surface 163 of the window 140; instead, it sits on a measurement support 168. The result is that there is a water layer 164 between the wafer 25 and the surface 163 of the window.

Once the measurement process has finished, the piston 160 returns the wafer 25 to its original position and the wafer support elements 150 return to their wafer receiving position. The piston 160 places the wafer 25 on the wafer support elements 150 and releases the vacuum. The external robot can now take the wafer to another exit station where there is a cassette of processed and measured wafers.

It will be appreciated by persons skilled in the art that the present invention is not limited to what has been particularly shown and described hereinabove. Rather the scope of the present invention is defined by the claims which follow:

We claim:

1. A thickness measuring unit for mounting on a water track of a polisher for measuring the thickness of a top layer of a wafer, said thickness measuring unit comprising:

a. a curved gate having a radius of curvature generally similar to that of said wafer, said curved gate being located at a gripping position;

b. a window mounted in a bottom surface of said water track;

c. a gripper for moving said wafer from said gripping position to a measuring position above a layer of water located above said window, said gripper including a gripping pad, having a planar surface wherein said planar surface of said gripping pad is at an angle to a horizontal plane; and d. an optical system, mounted underneath said window, for measuring said thickness of said top layer through said window and said layer of water.

2. A thickness measuring unit for mounting on a water bath for measuring the thickness of a top layer of a wafer, said thickness measuring unit comprising:

a. a window mounted in a bottom surface of said water bath;

b. a gripper for moving said wafer from a gripping position above said water bath to a measuring position above a layer of water located above said window, said gripper including a gripping pad having a planar surface, wherein said planar surface of said gripping pad is at an angle to a horizontal plane; and c. an optical system, mounted underneath said window, for measuring said thickness of said top layer through said window and said layer of water.

3. A method of measuring the thickness of a polished top layer of a wafer before removing said wafer from a polishing machine, said method comprising the steps of:

a. picking said wafer up from a gripping position;

b. moving said wafer from said gripping position to a measuring position;

c. immersing said wafer within a bath of water over said measuring position such that a plane defined by the circumference of said wafer is at an angle to a surface of said water;

d. placing said wafer in said measuring position underneath a surface of said water and above a window but with a thin layer of said water between said wafer and said window; and e. measuring said thickness of said top layer through said window and said thin layer of water.

4. A method according to claim 3 wherein said water is held within a water bath and wherein said step of moving comprises the step of rotating the plane of a lower surface of said water bath from a relatively horizontal plane to one which causes said water to move towards said measuring position.

* * * * *